US010511015B2

(12) United States Patent
Lee et al.

(10) Patent No.: US 10,511,015 B2
(45) Date of Patent: Dec. 17, 2019

(54) ELECTRODE FOR ELECTROCHEMICAL DEVICE, METHOD FOR PREPARING THE SAME, AND ELECTROCHEMICAL DEVICE COMPRISING THE SAME

(71) Applicant: LG CHEM, LTD., Seoul (KR)

(72) Inventors: Kyu Tae Lee, Seoul (KR); Young Jin Kim, Chungju-si (KR); Seong Mo Oh, Seoul (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/557,742

(22) PCT Filed: Oct. 12, 2016

(86) PCT No.: PCT/KR2016/011427
§ 371 (c)(1),
(2) Date: Sep. 12, 2017

(87) PCT Pub. No.: WO2017/065492
PCT Pub. Date: Apr. 20, 2017

(65) Prior Publication Data
US 2018/0069230 A1 Mar. 8, 2018

(30) Foreign Application Priority Data
Oct. 12, 2015 (KR) .................. 10-2015-0142399

(51) Int. Cl.
*H01M 4/134* (2010.01)
*H01M 4/1395* (2010.01)
(Continued)

(52) U.S. Cl.
CPC ............ *H01M 4/134* (2013.01); *H01G 11/22* (2013.01); *H01G 11/30* (2013.01); *H01G 11/32* (2013.01);
(Continued)

(58) Field of Classification Search
CPC ........ H01G 11/22; H01G 11/30; H01G 11/32; H01G 11/36; H01M 10/05; H01M 10/056;
(Continued)

(56) References Cited

U.S. PATENT DOCUMENTS

2004/0126653 A1* 7/2004 Visco .................. C03C 4/18
429/137
2004/0197641 A1 10/2004 Visco et al.
(Continued)

FOREIGN PATENT DOCUMENTS

CN        102491294 A    6/2012
JP        2006-503416 A  1/2006
(Continued)

OTHER PUBLICATIONS

International Search Report issued in PCT/KR2016/011427 (PCT/ISA/210), dated Jan. 11, 2017.
(Continued)

*Primary Examiner* — Adam A Arciero
(74) *Attorney, Agent, or Firm* — Birch, Stewart, Kolasch & Birch, LLP

(57) ABSTRACT

The present invention relates to a metal electrode, a method for preparing the same, and an electrochemical device comprising the same, and particularly, the present invention provides a metal electrode comprising a lithium or sodium metal electrode of which coating thickness can be controlled to a nano size, on which electrochemical active material, phosphorene in the form of two-dimensional monolayer thin film, or a multilayer thin film in which two or more layers of phosphorene are stacked is coated, a method for preparing the same, and an electrochemical device comprising the same.

21 Claims, 14 Drawing Sheets

(51) Int. Cl.
*H01G 11/32* (2013.01)
*H01M 10/056* (2010.01)
*H01G 11/30* (2013.01)
*H01G 11/36* (2013.01)
*H01G 11/22* (2013.01)
*H01L 31/0224* (2006.01)
*H01M 10/05* (2010.01)
*H01M 4/02* (2006.01)

(52) U.S. Cl.
CPC ......... *H01G 11/36* (2013.01); *H01L 31/0224* (2013.01); *H01M 4/1395* (2013.01); *H01M 10/05* (2013.01); *H01M 10/056* (2013.01); *H01M 2004/021* (2013.01); *Y02E 10/549* (2013.01); *Y02E 60/13* (2013.01)

(58) Field of Classification Search
CPC ........... H01M 2004/021; H01M 4/134; H01M 4/1395
See application file for complete search history.

(56) References Cited

U.S. PATENT DOCUMENTS

| | | | | |
|---|---|---|---|---|
| 2007/0048610 | A1* | 3/2007 | Tsang | H01M 4/38 429/218.1 |
| 2008/0038626 | A1* | 2/2008 | Park | C01B 25/02 429/50 |
| 2012/0183868 | A1 | 7/2012 | Toussaint et al. | |
| 2012/0183880 | A1* | 7/2012 | Toussaint | H01M 2/0207 429/481 |
| 2012/0258359 | A1 | 10/2012 | Saka | |
| 2013/0302704 | A1 | 11/2013 | Visco et al. | |
| 2015/0171467 | A1 | 6/2015 | Dubois et al. | |
| 2016/0126323 | A1 | 5/2016 | Lee et al. | |

FOREIGN PATENT DOCUMENTS

| | | |
|---|---|---|
| JP | 2007-513464 A | 5/2007 |
| JP | 2009-184861 A | 8/2009 |
| JP | 2015-115221 A | 6/2015 |
| KR | 10-2005-0070053 A | 7/2005 |
| KR | 10-2014-0125970 A | 10/2014 |
| KR | 10-1444189 B1 | 10/2014 |
| KR | 10-1522350 B1 | 5/2015 |
| WO | WO 2006/029561 A1 | 3/2006 |

OTHER PUBLICATIONS

European Search Report for Appl. No. 16855709.8 dated Jul. 31, 2018.

Nagao, M., et al, "All-solid-state lithium secondary batteries with high capacity using black phosphorus negative electrode," Journal of Power Sources, 2011, vol. 196, No. 16, pp. 6902-6905.

* cited by examiner

ELECTRODE FOR ELECTROCHEMICAL DEVICE, METHOD FOR PREPARING THE SAME, AND ELECTROCHEMICAL DEVICE COMPRISING THE SAME

TECHNICAL FIELD OF THE INVENTION

The present invention relates to an electrode for an electrochemical device, a method for preparing the same, and an electrochemical device comprising the same.

BACKGROUND OF THE INVENTION

With the recent increase in the importance of energy storage and conversion technology, various kinds of electrochemical devices are receiving attentions, and among them, secondary batteries are being mainly studied.

However, in case a metal electrode (for example, a lithium metal electrode, a sodium metal electrode, etc.) is used as an anode of the secondary battery, irreversible decomposition reactions may occur at the interface contacting solvents, metal salts, impurities, etc. in electrolyte, and the reaction products may be formed as a solid electrolyte interphase (SEI) on the surface of the metal electrode.

Such a solid electrolyte interphase is continuously formed with repeated decomposition and generation according to repeated charge/discharge, and causes performance deterioration of secondary batteries such as resistance increase on the surface of a metal electrode, and the resulting energy efficiency decrease, etc.

And, partial current density difference is induced by the solid electrolyte interphase, and it becomes a cause of dendrite formation on the surface of a metal electrode during charge. Such dendrite gradually grows by repeated charge/discharge, and causes internal short circuit between a cathode and an anode, thus causing performance deterioration of secondary batteries such as stability deterioration of secondary batteries, decrease in battery capacity, shortening of life characteristic, etc.

DETAILED DESCRIPTION OF THE INVENTION

Technical Problem

Accordingly, it is an object of the present invention to overcome the above indicated problems and improve the performance of electrochemical devices (specifically, secondary batteries), by introducing a coating layer on the surface of a metal electrode.

Technical Solution

One aspect of the present invention provides an electrode for an electrochemical device comprising a metal electrode, a coating layer positioned on the surface of the metal electrode, wherein the coating layer comprises two-dimensional semiconductor material, and metal phosphide converted from a part of the two-dimensional semiconductor material, and the two-dimensional semiconductor material is phosphorene in the form of a monolayer thin film, or a multilayer thin film in which two or more layers of phosphorene are stacked.

Specifically, the metal phosphide may be represented by the following Chemical Formula 1 or 2:

$$Li_xP \quad \text{[Chemical Formula 1]}$$

$$Na_xP \quad \text{[Chemical Formula 2]}$$

(In the Chemical Formulas 1 and 2, x satisfies $0.01 \leq x \leq 3$.)

Based on 100 wt % of the coating layer, the two-dimensional semiconductor material may be included in the content of 5 wt % or more and less than 100 wt %, and the metal phoshoide may be included in the content of greater than 0 wt % and 95 wt % or less.

The thickness of the coating layer may be 1 nm to 1 μm, particularly 1 nm to 100 nm.

The metal making up the metal electrode may be sodium or lithium.

Another aspect of the present invention provides a method for preparing an electrode for an electrochemical device comprising the steps of:

forming a coating layer comprising two-dimensional semiconductor material on the surface of a metal electrode; and converting a part of the two-dimensional semiconductor material in the coating layer into metal phosphide, wherein the two-dimensional semiconductor material is phosphorene in the form of a monolayer thin film, or a multilayer thin film in which two or more layers of phosphorene are stacked.

Specifically, in the step of converting a part of the two-dimensional semiconductor material in the coating layer into metal phosphide, the chemical alloying reaction of a part of the two-dimensional semiconductor material in the coating layer and the metal electrode may be achieved at the interface between the coating layer and the metal electrode.

More specifically, by the alloying reaction, metal phosphide represented by the following Chemical Formula 1 or 2 may be formed.

$$Li_xP \quad \text{[Chemical Formula 1]}$$

$$Na_xP \quad \text{[Chemical Formula 2]}$$

(in the Chemical Formulas 1 and 2, x satisfies $0.01 \leq x \leq 3$)

In the step of converting a part of the two-dimensional semiconductor material in the coating layer into metal phosphide, greater than 0 wt % and 95 wt % or less of the total 100 wt % of the two-dimensional semiconductor material in the coating layer may be converted into the metal phosphide.

Meanwhile, before the step of forming a coating layer comprising two-dimensional semiconductor material on the surface of a metal electrode, a step of delaminating the layered structure of black phosphorous to prepare the two-dimensional semiconductor material may be further included.

Specifically, the step of delaminating the layered structure of black phosphorous to prepare the two-dimensional semiconductor material may be conducted by sonication or mechanical ball milling.

The step of forming a coating layer comprising two-dimensional semiconductor material on the surface of a metal electrode may be conducted by spin coating, spray coating or sputtering.

Yet another aspect of the present invention provides an electrochemical device comprising a cathode, an anode and electrolyte;

wherein the anode comprises a metal electrode, and a coating layer positioned on the surface of the metal electrode; the coating layer comprises two-dimensional semiconductor material, and metal phosphide converted from a part of the two-dimensional semiconductor material, and the two-dimensional semiconductor material is phosphorene in the form of a monolayer thin film, or a multilayer thin film in which two or more layers of phosphorene are stacked.

Specifically, the metal phosphide may be represented by the following Chemical Formula 1 or 2.

$$Li_xP \quad \text{[Chemical Formula 1]}$$

$$Na_xP \quad \text{[Chemical Formula 2]}$$

(in the Chemical Formulas 1 and 2, x satisfies 0.01≤x≤3)

Meanwhile, the electrolyte may comprise an organic solvent; and a salt dissociable in the organic solvent.

Specifically, the organic solvent may be selected from a carbonate-based solvent, a nitrile-based solvent, an ester-based solvent, an ether-based solvent, a ketone-based solvent, an alcohol-based solvent, an aprotic solvent, or a mixture of two or more kinds thereof.

And, the dissociable salt may be a metal salt of $LiPF_6$, $LiBF_4$, $LiSbF_6$, $LiAsF_6$, $LiC_4F_9SO_3$, $LiClO_4$, $LiAlO_2$, $LiAlCl_4$, $LiN(C_xF_{2x+1}SO_2)(C_yF_{2y+1}SO_2)$ (wherein, x and y are natural numbers), LiCl, or LiI, or a mixture of two or more kinds thereof.

Here, the concentration of the salt to the organic solvent may be 0.1 to 5 M.

The cathode may be a layered metal oxide electrode, an air electrode, or a sulfur electrode.

Specifically, the layered metal oxide electrode may comprise a layered metal oxide represented by the following Chemical Formula 3:

$$X_aA_{1-b}R_bD_2 \quad \text{[Chemical Formula 3]}$$

(in the Chemical Formula 3, X is one or more elements selected from Li and Na,
A is one or more elements selected from Ni, Co, Mn, and V,
R is one or more elements selected from Al, Ni, Co, Mn, Cr, Fe, Mg, Sr, V, and rare earth elements,
D is one or more elements selected from O, F, S, and P,
a satisfies 0≤a≤2.4, and
b satisfies 0≤b≤0.5)

The electrochemical device may be a lithium secondary battery, a sodium secondary battery, a supercapacitor, or a dye-sensitized solar cell.

Advantageous Effects

According to the present invention, by introducing a coating layer on the surface of a metal electrode, 1) formation of dendrite on the surface of the metal electrode may be prevented, 2) decomposition at the interface with electrolyte may be inhibited, and thus, 3) performance of electrochemical devices (specifically, secondary batteries) may be improved, while maximizing compatibility with various electrolytes and cathodes.

DETAILED DESCRIPTION OF THE EMBODIMENTS

Figure 1:
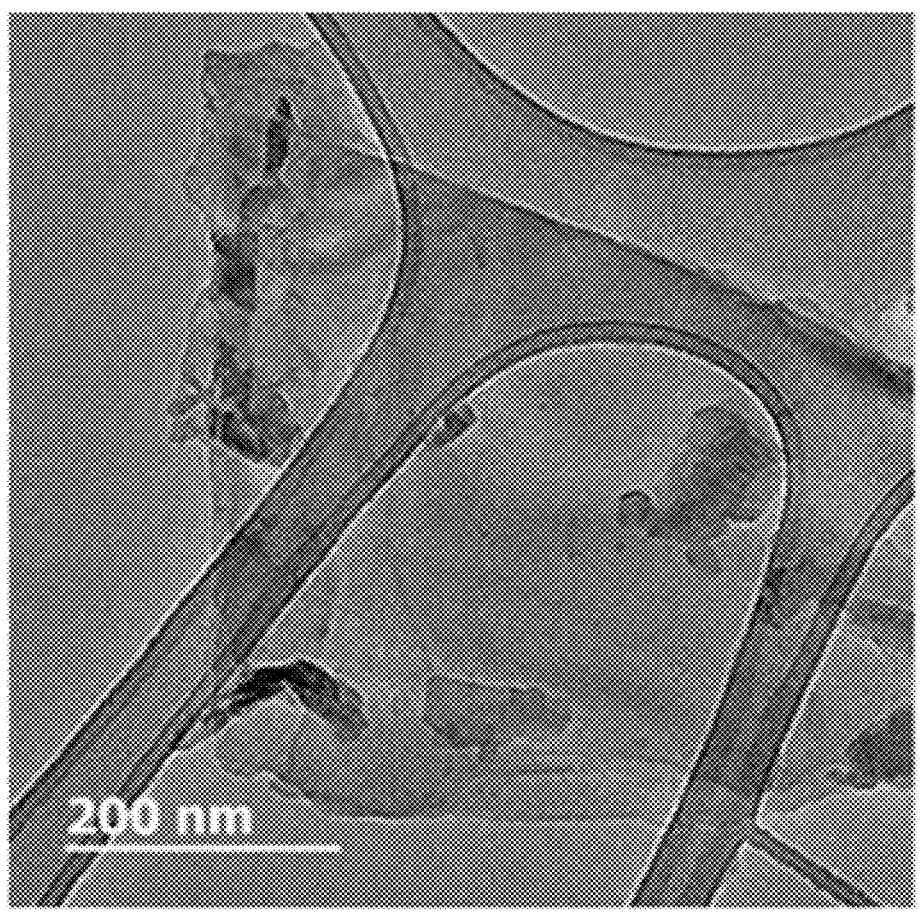
FIG. 1 is a TEM (transmission electron microscope) photo taken after sonication of black phosphorous, in the preparation example of the present invention.

Hereinafter, specific embodiments of the present invention will be explained in detail. However, these are presented only as the illustration of the present invention, the scope of the present invention is not limited thereby, and the present invention is defined only by the claims described below.

An Electrode for an Electrochemical Device

According to one aspect of the present invention, an electrode for an electrochemical device comprising a metal electrode, a coating layer position on the surface of the metal electrode,
wherein the coating layer comprises two-dimensional semiconductor material, and metal phosphide converted from a part of the two-dimensional semiconductor material, and
the two-dimensional semiconductor material is phosphorene in the form of a monolayer thin film, or a multilayer thin film in which two or more layers of phosphorene are stacked, is provided.

The above indicated problems, namely, the problems in terms of side reactions at the interface between a metal electrode-electrolyte, formation of dendrite in the metal electrode, etc., result from the use of a metal electrode as an anode. That is, it results from the use of a metal electrode as an anode, even if stable material is used as electrolyte itself, and it may be more worsen by the application of various cathodes.

In this regard, in one aspect of the present invention, by introducing a coating layer comprising two-dimensional semiconductor material and metal phosphide on the surface of a metal electrode, 1) formation of dendrite on the surface of the metal electrode may be prevented, 2) decomposition at the interface with electrolyte may be inhibited, and thus, 3) performance of electrochemical devices (specifically, secondary batteries) may be improved, while maximizing compatibility with various electrolytes and cathodes.

Although more details will be described below, the electrode for an electrochemical device may be prepared by the following processes.

First, on the surface of a metal electrode, two-dimensional semiconductor material, which is phosphorene in the form of a monolayer thin film, or a multilayer thin film in which two or more layers of phosphorene are stacked, is coated.

The phosphorene is in the form of a monolayer thin film obtained by delamination of several surface layers from black phosphorous. Contrary to graphene that is difficult to deform, it is regularly wrinkled and thus has advantages in that the properties can be easily controlled. And, it is a kind of semiconductor material with electrochemical activity, and contrary to NASICON commonly used as coating material, has electrochemical activity.

Thus, if the phosphorene contacts a metal electrode, a part of the semiconductor material may chemically react with the metal electrode, and as the reaction product, metal phosphide may be formed.

That is, on the surface of the metal electrode, a coating layer comprising the two-dimensional semiconductor material, and metal phosphide converted from a part of the two-dimensional semiconductor material is formed. In the coating layer, the two-dimensional semiconductor material and the metal phosphide do not separately exist as a mixture, but they exist while being complexed with each other.

The metal phosphide in the coating layer has higher oxidation-reduction potential than the metal electrode, and although it is electrically an insulator, has ionic conductivity, and thus, 1) it can prevent the formation of dendrite on the surface of the metal electrode, 2) inhibit decomposition at the interface with electrolyte, and thus, 3) can improve the performance of electrochemical devices (specifically, secondary batteries), while maximizing compatibility with various electrolytes and cathodes.

Hereinafter, the electrode for an electrochemical device will be explained in more detail.

First, the kind of the metal phosphide may be determined according to the method of coating and synthesis (coating) temperature, and in case lithium is used as a metal electrode, lithium phosphide may be formed, and in case sodium is used as a metal electrode, sodium phosphide may be formed. In this regard, the metal phosphide may be represented by the following Chemical Formula 1 or 2.

$Li_xP$      [Chemical Formula 1] 

$Na_xP$      [Chemical Formula 2] 

(in the Chemical Formulas 1 and 2, x satisfies 0.01≤x≤3)

Meanwhile, based on the total 100 wt % of the coating layer, the two-dimensional semiconductor material may be included in the content of 5 wt % or more and less than 100 wt %, and the metal phosphide may be included in the content of greater than 0 wt % and 95 wt % or less.

Here, since a part of the two-dimensional semiconductor material has been converted into the metal phosphide, the content of each material in the coating layer is related to the ratio converted into the metal phosphide to the total amount of the two-dimensional semiconductor material initially coated on the surface of the metal electrode.

Greater than 0 wt % and 95 wt % or less of the total 100 wt % of the two-dimensional semiconductor material in the coating layer may be converted into the metal phosphide, and the remaining 5 wt % or less and less than 100 wt % may remain in the coating layer.

The thickness of the coating layer may be 1 nm to 1 μm, particularly, 1 nm to 100 nm.

It means that, contrary to the existing coating, due to the fact that the coating material is a two-dimensional thin film, the thickness of the coating layer may be controlled to a thin thickness of 1 μm or less, and it may also reach to a very thin thickness of 1 nm. And, by appropriately controlling the coating method of phorphorene (concentration of the coating solution and coating number), it may be controlled to a medium thickness of 100 nm.

Meanwhile, the metal making up the metal electrode may be sodium or lithium. That is, the electrode for an electrochemical device may be one wherein the coating layer is introduced on the surface of a sodium metal electrode or lithium metal electrode.

A method for Preparing an Electrode for an Electrochemical Device

According to another aspect of the present invention, a method for preparing an electrode for an electrochemical device comprising the steps of:

forming a coating layer comprising two-dimensional semiconductor material on the surface of a metal electrode; and converting a part of the two-dimensional semiconductor material in the coating layer into metal phosphide, wherein the two-dimensional semiconductor material is phosphorene in the form of a monolayer thin film, or a multilayer thin film in which two or more layers of phosphorene are stacked, is provided.

It corresponds to the above explained preparation method of an electrode for an electrochemical device. The overall explanations of the preparation method are as described above and thus omitted, and each step will be explained in detail.

First, the method may further comprise a step of delaminating the layered structure of black phosphorous to prepare the two-dimensional semiconductor material, before the step of forming a coating layer comprising two-dimensional semiconductor material on the surface of a metal electrode.

Since the black phosphorous is material of a layered structure, it may be delaminated to phosphorene in the form of a monolayer thin film, or a multilayer thin film wherein two or more layers of phosphorene are stacked.

Specifically, the step of delaminating the layered structure of black phosphorous to prepare the two-dimensional semiconductor material may be conducted by sonication or mechanical ball milling.

More specifically, in case the sonication is used as the method of delaminating the layered structure of black phosphorous, the black phosphorous may be put into a solvent, and sonication may be conducted for several hours.

Here, as the solvent, those commonly used at the time of sonication such as a mixture of EC(Ethylene Carbonate) and DEC(Diethyl Carbonate) at a volume ratio of 1:1, NMP(N-Methyl-2-pyrrolidone), etc. may be used.

Thereafter, the step of forming a coating layer comprising two-dimensional semiconductor material on the surface of a metal electrode may be conducted by spin coating, spray coating or sputtering.

Specifically, as the method of forming a coating layer comprising two-dimensional semiconductor material, spin coating may be used.

Next, in the step of converting a part of the two-dimensional semiconductor material in the coating layer into metal phosphide, the chemical alloying reaction of a part of the two-dimensional semiconductor material in the coating layer and the metal electrode may be achieved at the interface between the coating layer and the metal electrode, and by the chemical alloying reaction of a part of the two-dimensional semiconductor material in the coating layer and the metal electrode, metal phosphide represented by the following Chemical formula 1 or 2 may be formed:

$Li_xP$      [Chemical Formula 1] 

$Na_xP$      [Chemical Formula 2] 

(in the Chemical Formulas 1 and 2, x satisfies 0.01≤x≤3)

In the step of converting a part of the two-dimensional semiconductor material in the coating layer into metal phosphide, greater than 0 wt % and 95 wt % or less of the total 100 wt % of the two-dimensional semiconductor material in the coating layer may be converted into the metal phosphide.

The explanations regarding this are described above, and thus, omitted.

If necessary, after the step of converting a part of the two-dimensional semiconductor material in the coating layer into metal phosphide, a step of drying may be further conducted, or omitted, and finally obtained material may be utilized as an electrode for an electrochemical device.

An Electrochemical Device

According to yet another aspect of the present invention, an electrochemical device comprising a cathode, an anode and electrolyte;

wherein the anode comprises a metal electrode, and a coating layer positioned on the surface of the metal electrode; the coating layer comprises two-dimensional semiconductor material, and metal phosphide converted from a part of the two-dimensional semiconductor material, and the two-dimensional semiconductor material is phosphorene in the form of a monolayer thin film, or a multilayer thin film in which two or more layers of phosphorene are stacked, is provided.

It corresponds to an electrochemical device that may use the above explained electrode for an electrochemical device as an anode, and apply various electrolytes and cathodes. The overall explanations regarding an electrode for an electrochemical device and an electrochemical device applying the same are as described above and thus omitted, and the remaining each construction will be explained in detail.

The electrolyte may comprise an organic solvent; and a salt dissociable in the organic solvent.

The electrolyte may be in the form of the metal salt dissolved in the organic solvent.

Thus, in the above explained preparation method of an electrode for an electrochemical device, after finishing the step of forming a coating layer comprising two-dimensional semiconductor material on the surface of the metal electrode, if assembled into an electrochemical device together with a cathode and electrolyte, the step of converting a part of the semiconductor material in the coating layer into metal phosphide may be conducted inside of the electrochemical device.

Here, the conversion into metal phosphide may be achieved by a chemical reaction occurred at the interface between the coating layer and the electrolyte, in addition to the chemical alloying reaction occurred at the interface between the coating layer and the metal electrode.

Here, the metal salt is not specifically limited as long as it is a salt dissociable in the organic solvent. For example, in case the metal salt is a lithium salt, it may be dissociated in the organic solvent and act as a source of lithium ion, and may perform a function for promoting the transfer of lithium ions between the cathode and anode of the electrochemical device comprising the same.

Specifically, in case the metal salt is a lithium salt, the dissociable salt may be a metal salt selected from $LiPF_6$, $LiBF_4$, $LiSbF_6$, $LiAsF_6$, $LiC_4F_9SO_3$, $LiClO_4$, $LiAlO_2$, $LiAlCl_4$, $LiN(C_xF_{2x+1}SO_2)(C_yF_{2y+1}SO_2)$(wherein, x and y are natural numbers), LiCl, LiI, or a mixture of two or more kinds thereof.

The concentration of the metal salt to the organic solvent may be 0.1 to 5.0 M. In this case, the metal salt may be dissolved in the organic solvent and contribute to the effective transfer of lithium ions, and the liquid electrolyte comprising the metal salt and the organic solvent may have appropriate ion conductivity and viscosity.

However, it is difficult to dissolve and dissociate the metal salt in the organic solvent at a high concentration greater than 5.0 M, and in this case, ion conductivity of the composite electrode may decrease.

To the contrary, if the metal salt is dissolved and dissociated in the organic solvent at a low concentration of less than 0.1 M, due to decrease in the content of the ion conductive metal salt, ion conductivity of the composite electrode may decrease.

The organic solvent is not specifically limited as long as it is material capable of functioning as a medium in which ions involving in the electrochemical reaction of electrochemical devices can move, but it may be a solvent exhibiting a high boiling point. In this case, electrolyte comprising the high boiling point organic solvent may also exhibit high boiling point property.

For example, the organic solvent may be selected from a carbonate-based solvent, a nitrile-based solvent, an ester-based solvent, an ether-based solvent, a ketone-based solvent, an alcohol-based solvent, an aprotic solvent, or a mixture of two or more kinds thereof.

As the carbonate-based solvent, dimethyl carbonate (DMC), diethyl carbonate(DEC), dipropyl carbonate(DPC), methylpropyl carbonate(MPC), ethylpropyl carbonate (EPC), methylethyl carbonate(MEC), ethylene carbonate (EC), propylene carbonate(PC), butylenes carbonate(BC), etc. may be used. And, it may be a cyclic carbonate-based solvent such as ethylene carbonate, propylene carbonate, g-butylrolactone, etc.

As the nitrile-based solvent, acetonitrile, succinonitrile, adiponitrile, sebaconitrile, etc. may be used.

As the ester-based solvent, methyl acetate, ethyl acetate, n-propyl acetate, 1,1-dimethyl acetate, methylpropionate, ethylpropionate, γ-butylolactone, decanolide, valerolactone, mevalonolactone, caprolactone, etc. may be used.

As the ether-based solvent, dibutyl ether, hydrofluoroether, dimethylether, etc. may be used, and as the ketone-based solvent, cyclohexanone, etc. may be used.

As the glyme-based solvent, ethylene glycol dimethyl ether, triethylene glycol dimethyl ether, tetraethylene glycol dimethyl ether, etc. may be used.

As the alcohol-based solvent, ethyl alcohol, isopropyl alcohol, etc. may be used, and as the aprotic solvent, nitriles such as R—CN(R is a C2-20 linear, branched or cyclic hydrocarbon group, and may include a double bond, aromatic ring or ether bond), etc., amides such as dimethyl formamide, etc., dioxolanes such as 1,3-dioxolane, etc., sulfolane, etc. may be used.

The organic solvent may be used alone or in combinations, and in the latter case, the mixing ratio may be appropriately controlled according to the aimed battery performance, which may be widely understood by a person having ordinary knowledge in the art. Meanwhile, the cathode may be a commonly used layered metal oxide electrode. For example, it may be made of lithium nickel oxide, lithium cobalt oxide, lithium nickel manganese oxide, lithium nickel cobalt manganese oxide, lithium nickel cobalt aluminum oxide, etc. And, it may be at least one selected from lithium phosphate, material capable of reversibly intercalating/ deintercalating lithium ions, lithium alloy, material capable of doping and dedoping lithium, transition metal oxide, and a mixture thereof.

And, the cathode may be a layered metal oxide electrode comprising sodium. For example, it may be sodium nickel oxide, sodium cobalt oxide, sodium nickel manganese oxide, sodium nickel cobalt manganese oxide, sodium nickel cobalt aluminum oxide, etc. And, it may be at least one selected from the group consisting of lithium phosphate, material capable of reversibly intercalating/deintercalating sodium ions, sodium alloy, material capable of doping and dedoping sodium, transition metal oxide, and a mixture thereof.

To the contrary, the cathode may be an air electrode.

Specifically, the layered metal oxide electrode may comprise layered metal oxide represented by the following Chemical Formula 3.

$$X_a A_{1-b} R_b D_2 \quad \text{[Chemical Formula 3]}$$

(in the Chemical Formula 3, X is one or more elements selected from Li and Na,
A is one or more elements selected from Ni, Co, Mn, and V,
R is one or more elements selected from Al, Ni, Co, Mn, Cr, Fe, Mg, Sr, V, and rare earth elements,
D is one or more elements selected from O, F, S, and P,
a satisfies $0 \leq a \leq 2.4$, and
b satisfies $0 \leq b \leq 0.5$)

As the material capable of reversibly intercalating/deintercalating lithium ions, carbonaceous active material commonly used in lithium ion secondary batteries may be used, and the representative examples thereof may include crystalline carbon, non-crystalline carbon, or a combination thereof. Examples of the crystalline carbon may include natural graphite or artificial graphite of amorphous, laminar, flake, spherical or fiber shape, and examples of the non-crystalline carbon may include soft carbon (low temperature fired carbon) or hard carbon, mesophase pitch carbide, fired cokes, etc.

As the lithium metal alloy, alloy of lithium and Na, K, Rb, Cs, Fr, Be, Mg, Ca, Sr, Si, Sb, Pb, In, Zn, Ba, Ra, Ge, Al or Sn metal may be used.

As the material capable of doping and dedoping lithium, Si, $SiO_x$ ($0<x<2$), Si—C composite, Si-Q alloy(Q is alkali metal, alkali earth metal, Group 13 to 16 atom, transition metal, rare earth element or combinations thereof, provided that is it not Si), Sn, $SnO_2$, Sn—C composite, Sn—R(R is alkali metal, alkali earth metal, Group 13 to 16 atom, transition metal, rare earth element, or combinations thereof, provided that it is not Sn), etc. may be used. Specific elements of the Q and R may include Mg, Ca, Sr, Ba, Ra, Sc, Y, Ti, Zr, Hf, Rf, V, Nb, Ta, Db, Cr, Mo, W, Sg, Tc, Re, Bh, Fe, Pb, Ru, Os, Hs, Rh, Ir, Pd, Pt, Cu, Ag, Au, Zn, Cd, B, Al, Ga, Sn, In, Ti, Ge, P, As, Sb, Bi, S, Se, Te, Po or combinations thereof.

As the transition metal oxide, vanadium oxide, lithium vanadium oxide, etc. may be used.

A cathode having a coating layer on the surface may be also used, or the above described compounds and the compounds having a coating layer may be mixedly used. The coating layer may comprise oxide or hydroxide of the coating element, oxyhydroxide of the coating element, oxycarbonate of the coating element, or hydroxycarbonate of the coating element as the compound of the coating element. The compounds making up the coating layer may be non-crystalline or crystalline. As the coating element included in the coating layer, Mg, Al, Co, K, Na, Ca, Si, Ti, V, Sn, Ge, Ga, B, As, Zr or a mixture thereof may be used. As a process of forming the coating layer, any coating methods can be used as long as they do not have a bad influence of the properties of positive active material (for example, spray coating, dipping method, etc.), which can be easily understood by a person having ordinary knowledge in the art and the detailed descriptions are omitted.

Meanwhile, a separator may exist between the cathode and the anode. As the separator, polyethylene, polypropylene, polyvinylidene fluoride, or a multilayer of two or more layers thereof may be used, and a mixed multilayer such as polyethylene/polypropylene two-layer separator, polyethylene/polypropylene/polyethylene three-layer separator, polypropylene/polyethylene/polypropylene three-layer separator, etc. may also be used.

The electrochemical device may be a lithium secondary battery, a sodium secondary battery, a supercapacitor, or a dye-sensitized solar cell Hereinafter, preferable Examples of the present invention, Comparative Examples compared to the Examples, and Evaluation Examples comparing the properties thereof will be described. However, the following examples are presented as only as the preferable examples of the present invention, and the present invention is not limited thereby.

I. Preparation of a Metal Electrode Coated with Phosphorene, Manufacture of a Metal Secondary Battery Comprising the Same, and Conversion of a Part of Phosphorene into Metal Phosphide Specifically, in the following Examples, electrodes were prepare by the common process as follows, and batteries were manufactured using the electrodes as anodes together with various electrolytes and cathodes.

(Preparation Example 1) Preparation of Phosphorene

First, 70 mg of black phosphorous was put in 30 ml of EC:DEC (vol. 1:1) solvent under inert atmosphere, and sonicated for 30 hours while maintaining 30° C. or less.

As the result, a thin film with a thin thickness of 1 nm to 50 nm was formed, as confirmed by transmission electron microscope (TEM) photograph of FIG. 1.

Figure 2:
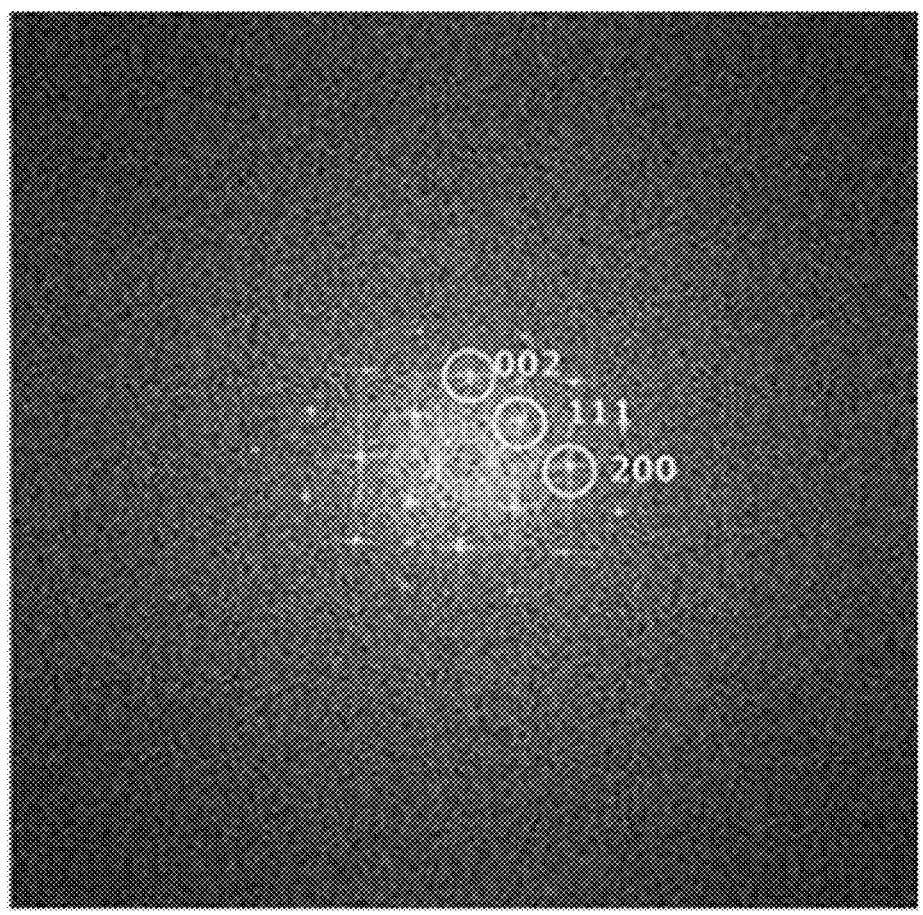
FIG. 2 is a FFT (fast Fourier transform) pattern measured after sonication of phosphorous, in the preparation example of the present invention.

Such a thin film with a thin thickness shows (0 0 2), (1 1 1), and (2 0 0) pattern, which is the same as black phosphorous, in the fast Fourier transform (FFT) pattern of FIG. 2.

It can be seen from FIGS. 1 and 2 that as the result of sonication of black phosphorous, the layered structure was delaminated and phosphorene in the form of a monolayer thin film or a multilayer thin film in which two or more layers of phosphorene are stacked was formed.

(Preparation Example 2) Surface Coating of Metal Electrode

The surface of a metal electrode was coated with the phosphorene (Preparation Example 1), wherein the metal electrode used was selected from a lithium metal electrode (thickness: 0.7 mm) and a sodium metal electrode (thickness: 1 mm) according to the following Examples.

Specifically, 100 μl of the phosphorene was taken and spin coated for 1 minute at a rotation speed of 500 rpm. Thereafter, it was dried at room temperature for 10 minutes to obtain a metal electrode coated with phosphorene.

(Preparation Example 3) Manufacture of Metal Secondary Battery

Using the phosphorene-coated metal electrode (Preparation Example 2) as a anode, and using various material as electrolyte and a cathode, metal secondary batteries of various shapes were manufactured according to a common manufacturing method.

Figure 3:
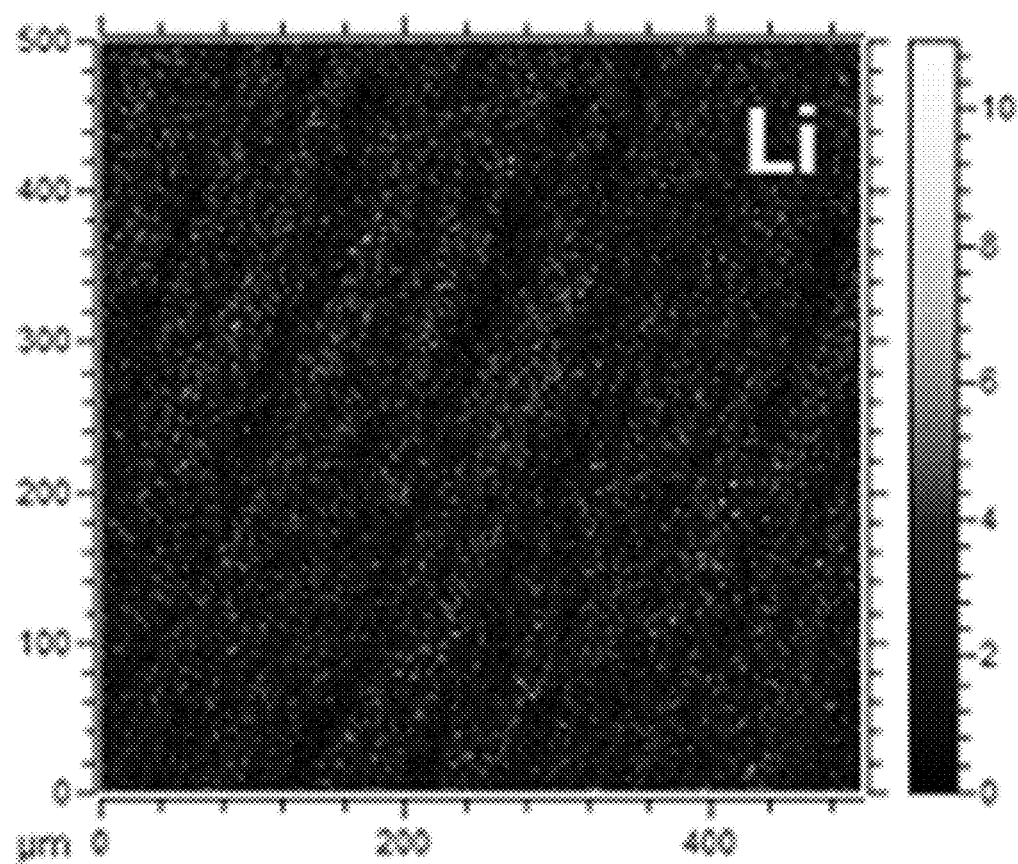
FIGS. 3 and 4 are mappings obtained as the result of ToF-SIMS (time-of-flight secondary ion mass spectrometry), after dropping electrolyte on phosphorene coated on the surface of a lithium metal electrode, in the preparation example of the present invention.
Figure 4:
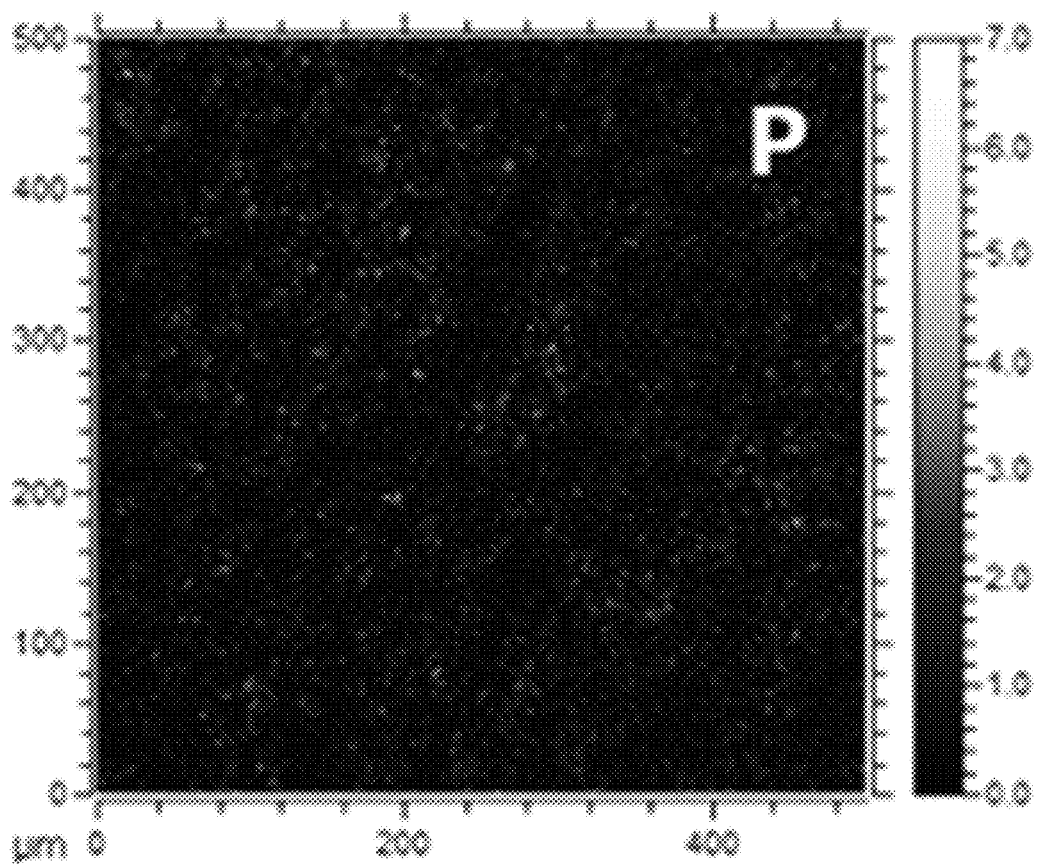

Separately, on the phosphorene coated on the surface of a lithium metal electrode, EC:DEC (3:7 vol.) electrolyte in which 1 M LiClO$_4$ salt was dissolved was dropped, and then, as the result of time-of-flight secondary ion mass spectrometry (ToF-SIMS), mappings of FIGS. 3 and 4 were obtained.

From the lithium mapping of FIG. 3 and the phosphorous mapping of FIG. 4, it can be confirmed that a part of the phosphorene coated on the surface of the lithium metal electrode reacted with metal salts in the electrolyte, and was converted into lithium phosphide.

Thus, it can be inferred that, in metal secondary batteries, a part of the phosphorene coated on the metal electrode may react with metal salts in the electrolyte and be converted into metal phosphide, and consequently, a complex form of phosphorene and metal phosphide may exist on the surface coating layer of the metal electrode (thickness: several tens of nm).

II. Evaluation According to the Kind of Electrolyte

The phosphorene-coated lithium metal electrode (Preparation Example 2) was used both as a cathode and a anode, and between the anode and the cathode, a separator made of polyethylene was inserted into a battery container, and electrolyte was injected, thus manufacturing Li(anode)/Li (cathode) symmetric cell in the form of 2032 coin-cell according to a common manufacturing method, which was decided as Example.

Unlike to the Example, a Li/Li symmetric cell wherein a non-coated lithium metal electrode was used both in a cathode and a anode was manufactured, which was decided as Comparative Example.

For each Li(anode)/Li(cathode) symmetric cell, anode performance according the kind of electrolyte was evaluated.

In the drawings showing the evaluation results, Examples were indicated as "phosphorene" meaning that the phosphorene-coated lithium metal electrode was used in the cathode and anode, and Comparative Examples were indicated as "bare" meaning that non-coated lithium metal electrode was used in the cathode and anode.

(Example 1 and Comparative Example 1) In Case Carbonate-Based Electrolyte was Used A lithium salt LiPF$_6$ was dissociated in organic solvents of EC (Ethylene Carbonate) and DEC(Diethyl Carbonate) at a volume ratio of 3:7 to the concentration of 1.3 M, which as used as a carbonate-based electrolyte.

Figure 5:
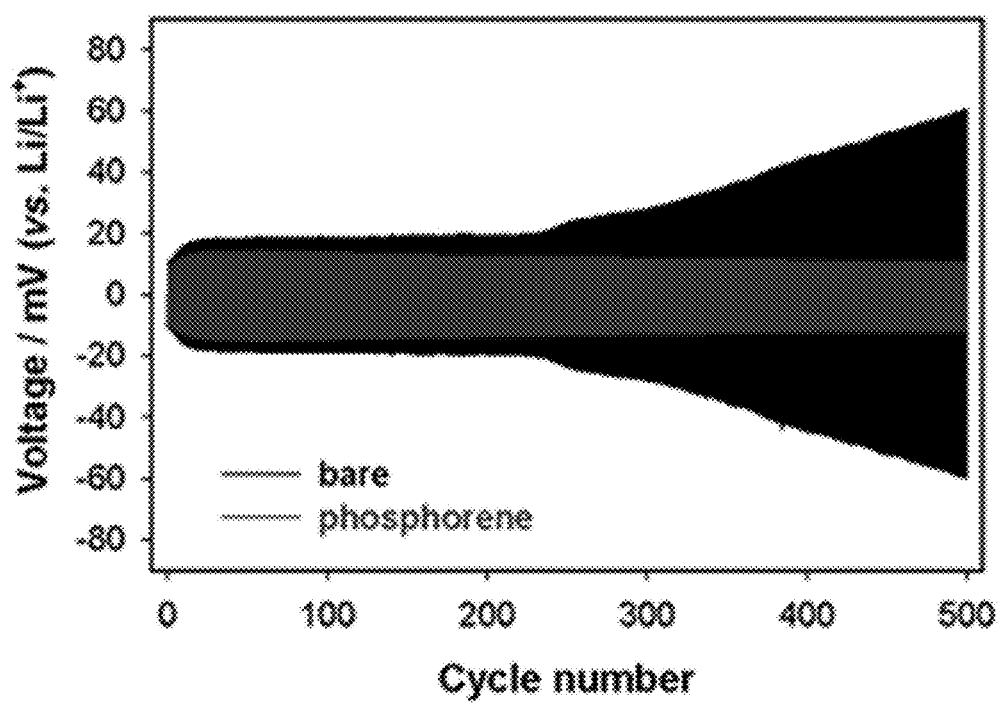
FIG. 5 reports the cycle properties of Example 1 and Comparative Example 1.

In this case, the Li/Li symmetric cells of Example 1 and Comparative Example 1 were charged and discharged for each 30 minutes at a current rate of 100 µA cm$^{-2}$, and the cycle properties were reported in FIG. 5.

According to FIG. 5, it was confirmed that in the case of Comparative Example 1, resistance rapidly increased after 200 cycles. It results from the continuous generation of electrolyte decomposition under repeated charge/discharge condition, and accumulation of unstable SEI, according to the use of non-coated lithium metal electrodes.

To the contrary, it was confirmed that in the case of Example 1, resistance did not increase even for 500 cycles. It results from the partial conversion into lithium phosphide (Li$_x$P) having high oxidation-reduction potential, and the formation of stable SEI, by the electrochemical self discharge in the electrolyte, according to the use of phosphorene-coated lithium metal electrode as a cathode and a anode.

That is, it can be assessed that unlike Comparative Example 1 wherein unstable SEI was formed due to electrolyte decomposition, in Example 1, stable SEI was formed according to phosphorene and lithium phosphide (Li$_x$P) partially converted therefrom, additional electrolyte decomposition was minimized when cycles were progressed, resistance did not increase, and stable cycle property was exhibited.

(Example 2 and Comparative Example 2) In Case Glyme-Based Electrolyte was Used

A lithium salt, lithium bis(trifluoromethanesulfony)imide (LiTFSI), was diccosiated in an organic solvent of tetraethylene glycol dimethyl ether to the concentration of 1 M, which was used as glyme-based electrolyte.

Figure 6:
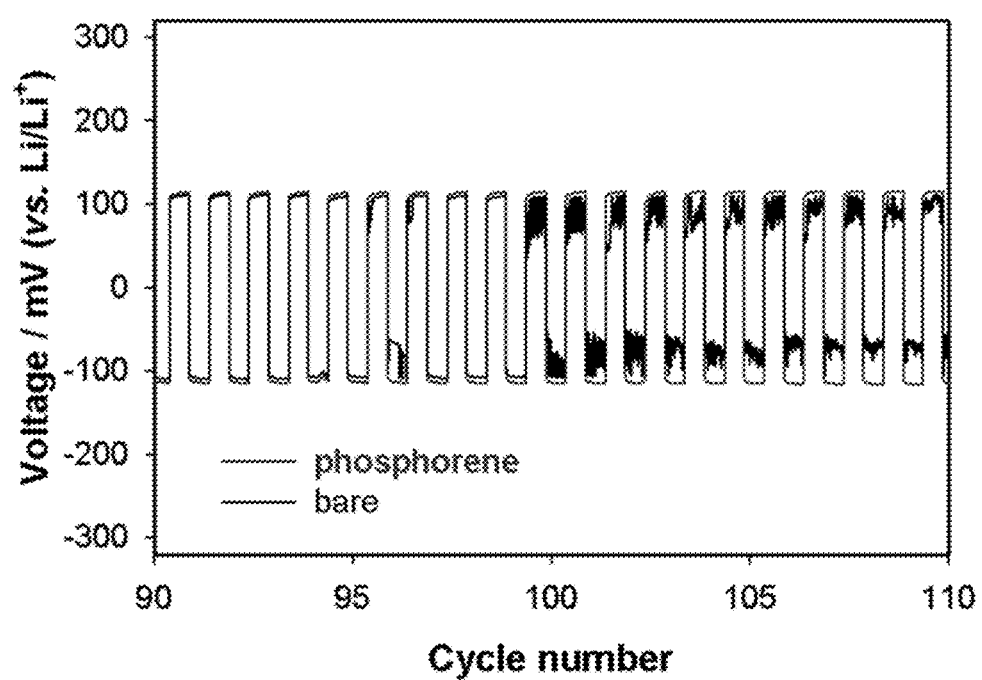
FIG. 6 reports the cycle properties of Example 2 and Comparative Example 2.

In this case, the Li/Li symmetric cells of Example 2 and Comparative Example 2 were charged and discharged for each 30 minutes at a current rate of 100 µA cm$^{-2}$, and the cycle properties were reported in FIG. 6.

Meanwhile, according to FIG. 6, it can be seen that in the case of Example 2, dendrite growth was inhibited compared to Comparative Example 2. In the case of Comparative Example 2, from around 100 cycles, dendrite was formed on the surface of a anode and partial short circuit occurred, and thus, a stable flat potential side did not occur, and unstable voltage curve with continuous potential change was observed, and consequently, short circuit gradually increased and converged on around 0 V. However, in the case of Example 2, a stable voltage curve appeared.

(Example 3 and Comparative Example 3) In Case N,N-dimethylacetamide (DMA)-Based Electrolyte I was Used In general, DMA-based electrolyte is known to corrode a lithium metal anode. In order to confirm whether or not the electrode of Example is stable even to such DMA-based electrolyte, a kind of a lithium salt, lithium bis(trifluoromethane sulfonyl) imide (LiTFSI) was dissociated in an organic solvent of DMA to the concentration of 1 M, which was used as DMA-based electrolyte.

Figure 7:
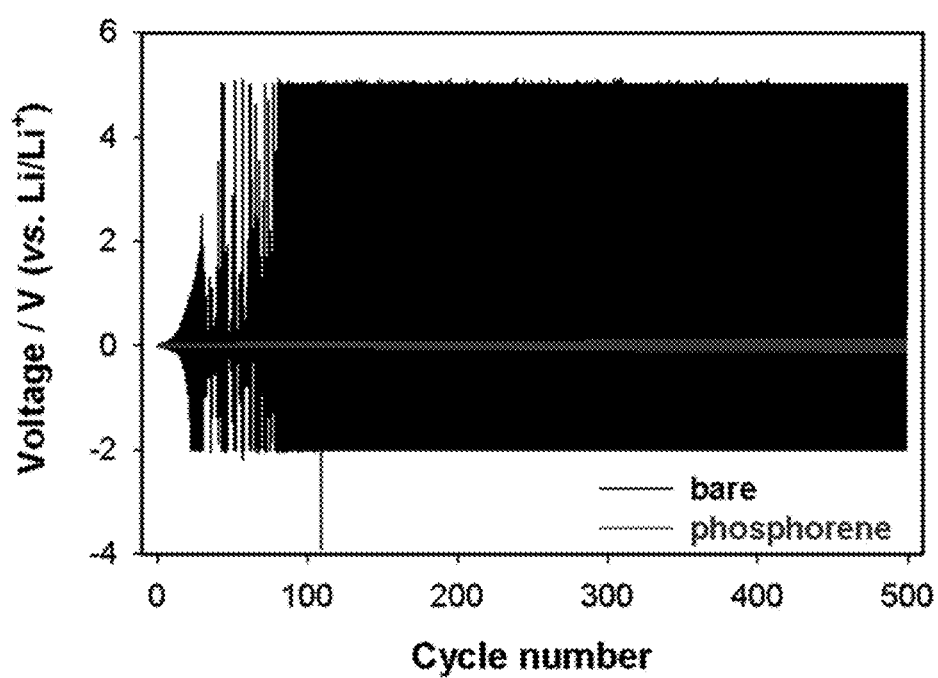
FIG. 7 reports the cycle properties of Example 3 and Comparative Example 3.

In this case, the Li/Li symmetric cells of Example 3 and Comparative Example 3 were charged and discharged for each 30 minutes at a current rate of 100 µA cm$^{-2}$, and the cycle properties were reported in FIG. 7.

According to FIG. 7, it is confirmed that in the case of Comparative Example 3, resistance rapidly increased compared to Example 3, which results from the corrosion of the lithium metal electrode by DMA-based electrolyte. To the contrary, in the case of Example 3, a stable voltage curve and cycle property were exhibited even for 500 cycles.

(Example 4 and Comparative Example 4) In Case N,N-dimethylacetamide (DMA)-Based Electrolyte II was Used Recently, DMA-based electrolyte in which another kind of a lithium salt, LiNO$_3$, is dissociated, has been reported, and it is known to be suitable for a lithium air battery because it does not corrode a lithium metal electrode.

In order to confirm this, LiNO$_3$ was dissociated in an organic solvent of DMA to the concentration of 1 M, which was used as DMA-based electrolyte.

Figure 8:
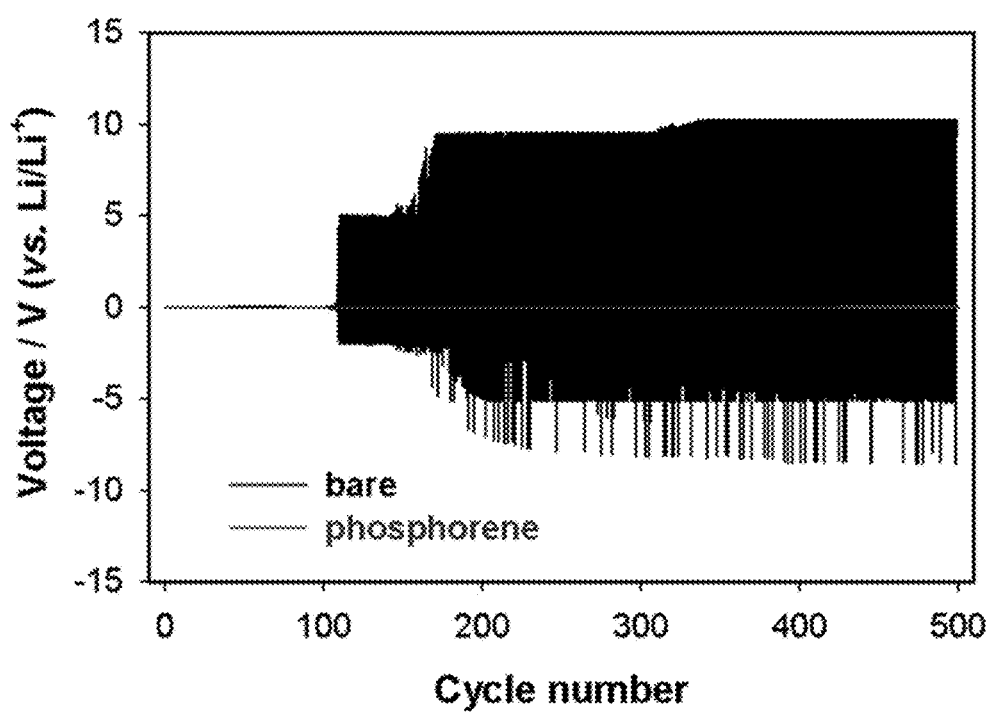
FIG. 8 reports the cycle properties of Example 4 and Comparative Example 4.

In this case, the Li/Li symmetric cells of Example 4 and Comparative Example 4 were charged and discharged for each 30 minutes at a current rate of 100 μA cm$^{-2}$, and the cycle properties were reported in FIG. 8.

According to FIG. 8, it is confirmed that in the case of Comparative Example 4, although stable charge/discharge behavior was exhibited compared to Comparative Example 3, resistance rapidly increased after 100 cycles. Thus, it can be seen that, even if electrolyte in which LiNO$_3$ is dissolved is used, LiNO$_3$ is entirely consumed as the cycle progresses for a long time, and after that, it is inevitable that the side reactions of electrolyte rapidly progresses and resistance increases. To the contrary, Example 4 constantly exhibited stable charge/discharge behavior until 500 cycles.

III. Evaluation According to the Kind of Cathodes

Unlike the previous evaluation according to the kind of electrolytes, using a lithium-rich oxide electrode (Li$_{1.4}$Ni$_{0.2}$Co$_{0.1}$Mn$_{0.7}$O$_{2.4}$) or an air electrode as a cathode, and using a coated lithium metal electrode as a anode, a lithium (anode)/lithium-rich oxide electrode (cathode) cell in the form of 2032 coin-cell or a Li-air cell in the form of Sqagelok cell was manufactured, which was decided as Example.

Unlike Example, using a non-coated lithium metal electrode as a anode, a lithium (anode)/lithium-rich oxide electrode (cathode) cell or a Li-air cell was manufactured, which was decided as Comparative Example.

According to the kinds of cathode, battery performance was evaluated.

In the drawings showing each evaluation result, Examples were indicated as "phosphorene" meaning that a phosphorene-coated lithium metal electrode was used as a anode, and Comparative Examples were indicated as "bare" meaning that a non-coated lithium metal electrode was used as a anode.

Figure 9:
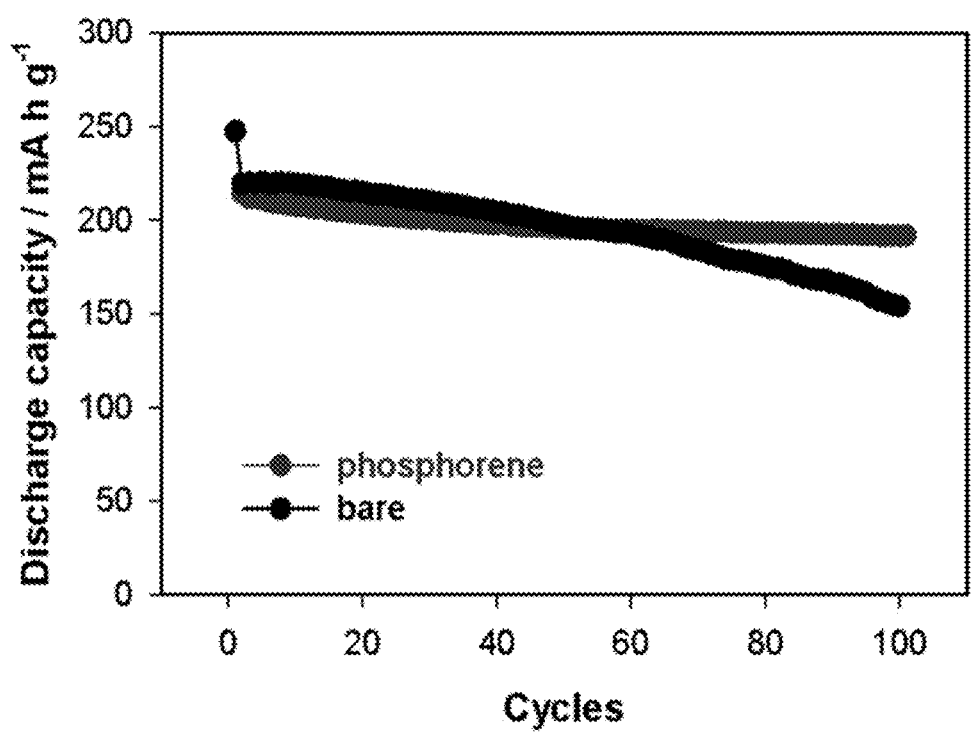
FIG. 9 reports the cycle properties of Example 5 and Comparative Example 5.
Figure 10:
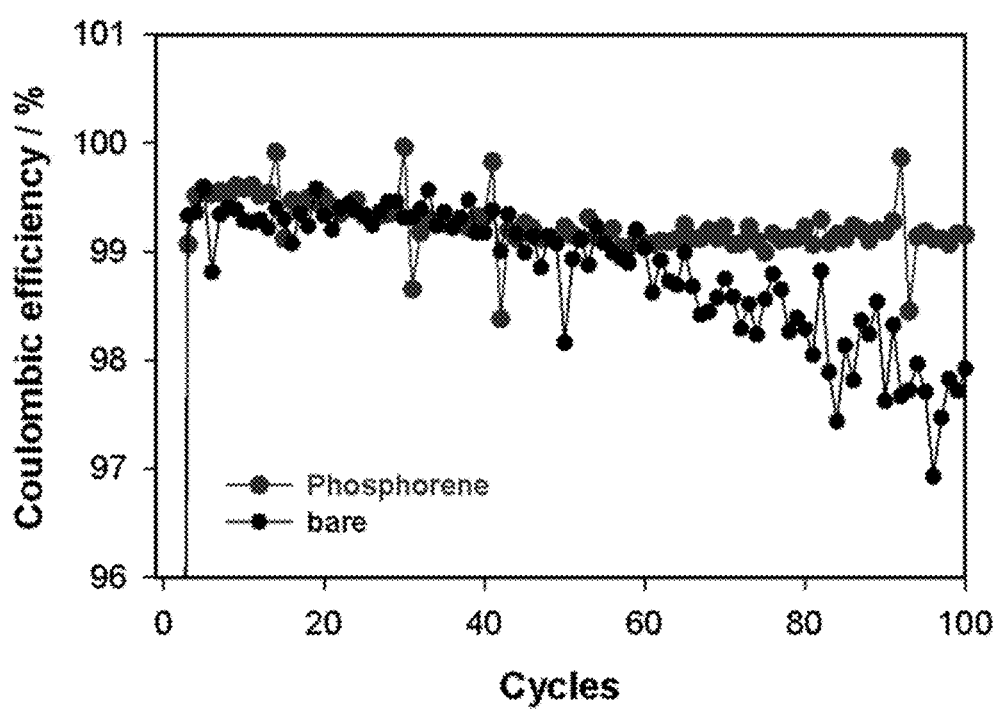
FIG. 10 reports the Coulomb efficiency properties of Example 5 and Comparative Example 5.

(Example 5 and Comparative Example 5) In Case a Li-Rich Layered Cathode was Used The batteries of Example 5 and Comparative Example 5 were respectively manufactured by the same method as Example 1 and Comparative Example 1, except using a Li$_{1.4}$Ni$_{0.2}$Co$_{0.1}$Mn$_{0.7}$O$_{2.4}$ cathode. Thereafter, the batteries were charged and discharged under condition of 1C (200 mA g$^{-1}$) for 100 cycles, and the cycle properties and Coulomb efficiency properties were respectively reported in FIG. 9 and FIG. 10.

In general, it is known that if a Li-rich layered cathode is used, oxygen is generated during the charge process, such reactive oxygen decomposes electrolyte, a part of the decomposed electrolyte diffuses onto the surface of a lithium metal anode surface and is accumulated in the form of a film, which becomes another cause of resistance increase on the surface of a anode. Such a phenomenon is confirmed in Comparative Example 5.

However, in the case of Example 5, it is confirmed that life characteristic (FIG. 9) and Coulomb efficiency (FIG. 10) were improved compared to Comparative Example 5. It also arises from the use of the phoshporene-coated lithium metal electrode as a anode, and the resulting contact with electrolyte, and partial conversion into lithium phosphide (Li$_x$P) having high oxidation-reduction potential, and the formation of stable SEI.

That is, it can be assessed that if stable SEI is formed according to phosphorene and lithium phosphide (Li$_x$P) partially converted therefom, electrode decomposed due to the use of a Li-rich layered cathode is less influenced.

(Example 6 and Comparative Example 6) In Case an Air Electrode is Used as a Cathode An air electrode slurry was formed using Super P PTFE as a binder, and then coated on a current collector GDL (Gas diffusion layer), and used as a cathode, and DMA-based electrolyte identical to Example 3 and Comparative Example 3 and lithium were used to manufacture lithium air batteries in the form of Swagelok cell of Example 6 and Comparative Example 6. Thereafter, the batteries were charged and discharged under condition of 0.2 C (200 mA g$^{-1}$) at a fixed quantity charge of 1000 mA h g$^{-1}$ for 100 cycles, and the charge/discharge curves and cycle properties were respectively reported in FIGS. 11 to 13.

Figure 11:
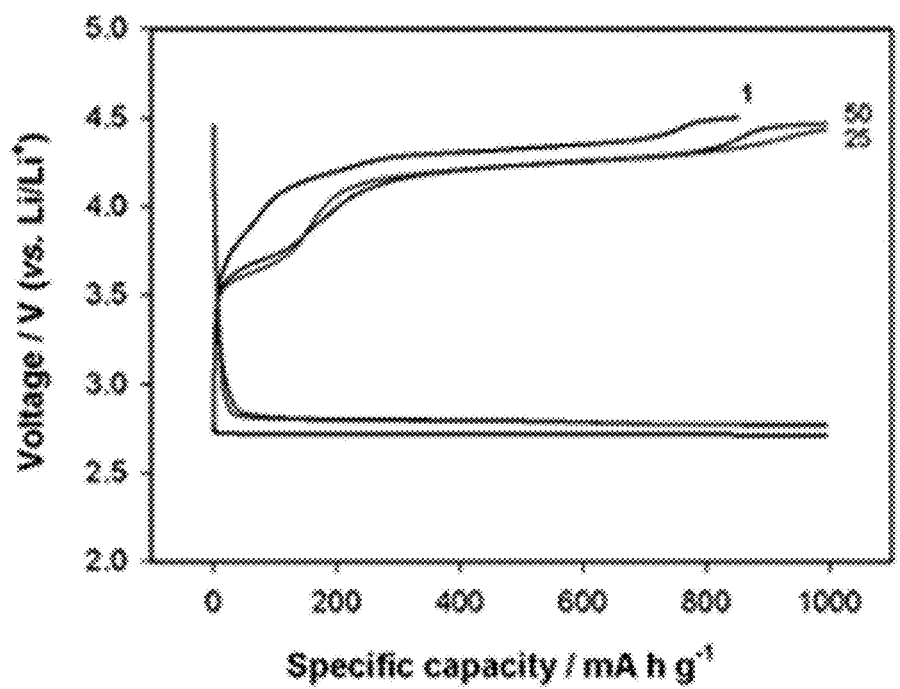
FIG. 11 reports the charge/discharge curve of Example 6.
Figure 12:
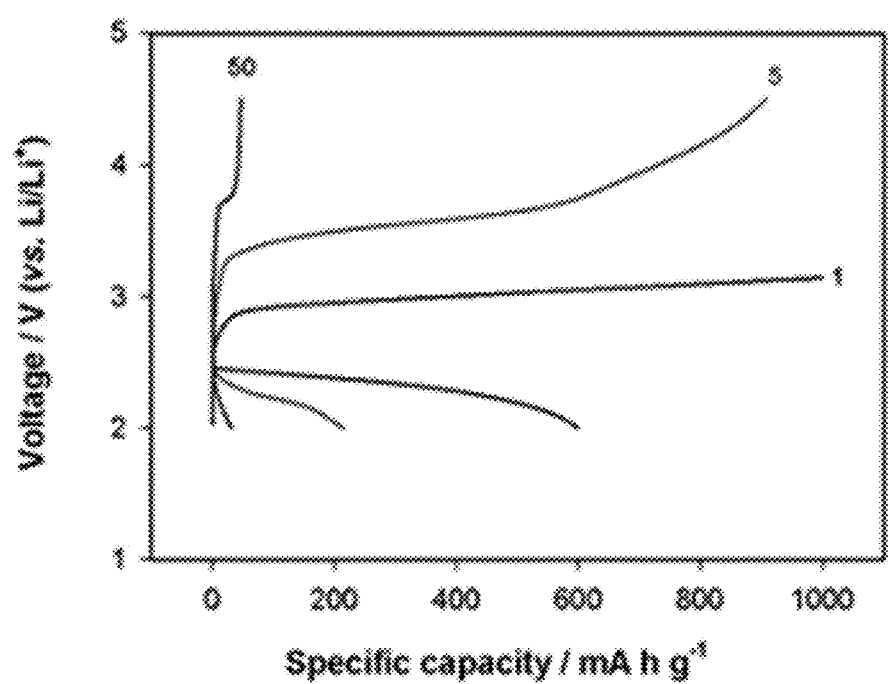
FIG. 12 reports the charge/discharge curve of Comparative Example 6.
Figure 13:
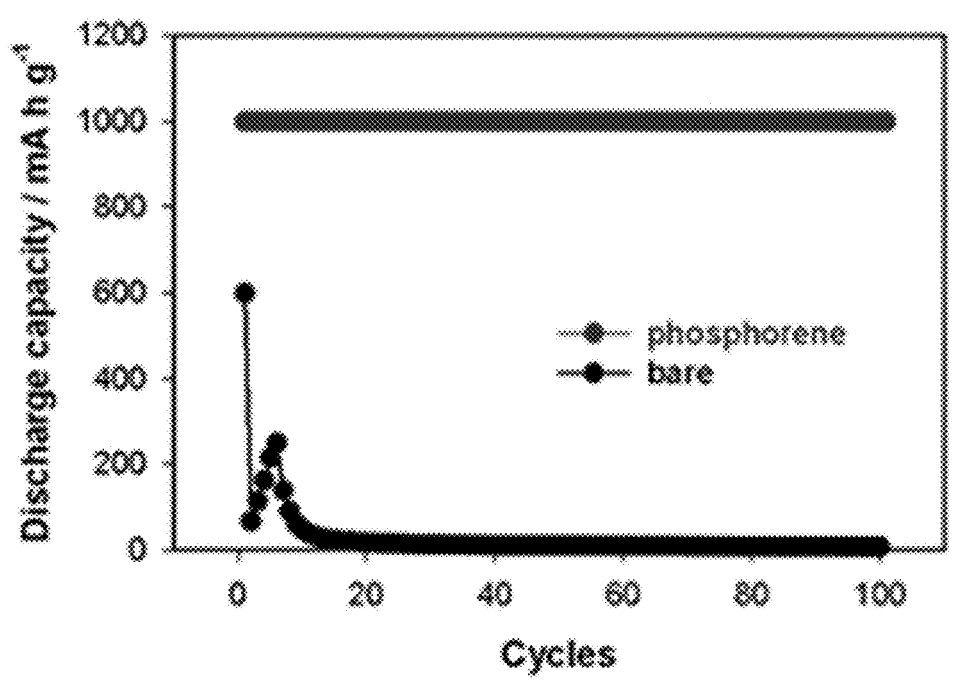
FIG. 13 reports the cycle properties of Example 6 and Comparative Example 6.

Specifically, FIG. 11 reports the charge/discharge curves of the battery of Example 6, FIG. 12 reports the charge/discharge curves of the battery of Comparative Example 6, and FIG. 13 reports the cycle properties of Example 6 and Comparative Example 6.

Comparing FIGS. 11 and 12, it is observed that in the case of Comparative Example 6 (FIG. 12), charge/discharge curves are rapidly degenerated, while in the case of Example 6 (FIG. 11), stable charge/discharge curves appear. It is also confirmed in FIG. 13 that the cycle property of Example 6 is far superior to Comparative Example 6.

It also arises from the use of phosphorene-coated lithium metal electrode as a anode, and the resulting electrochemical self-discharge in the electrolyte, partial conversion into lithium phosphide (Li$_x$P) having high oxidation-reduction potential, and the formation of stale SEI.

That is, it can be assessed that if stable SEI is formed according to phosphorene and lithium phosphide (Li$_x$P) partially converted therefrom, even if an air electrode is used as a cathode and DMA-based electrolyte is used, charge/discharge property and cycle life property are maintained excellent.

IV. Evaluation According to the Kind of Anode

Unlike the previous evaluations, the phosphorene-coated sodium metal electrode was used as a cathode and a anode, and between the anode and the cathode, a separator made of polyethylene was put in a battery container and electrolyte was injected, and a Na/Na symmetric cell in the form of 2032 coin-cell was manufactured according to a common manufacturing method, which was decided as Example.

Unlike Examples, a Na/Na symmetric cell wherein a non-coated sodium metal electrode was used both as a cathode and a anode was manufactured, which was decided as Comparative Example.

For each Na/Na symmetric cell, electrochemical performance according to the use of carbonate electrolyte was evaluated.

In the drawings showing each evaluation result, Example was indicated as "phoshporene" meaning that a phosphorene-coated sodium metal electrode was used as a anode, and Comparative Example was indicated as "bare" meaning that a non-coated sodium metal electrode was used as a anode.

(Example 7 and Comparative Example 7) In Case a Sodium Metal Anode was Used

Specifically, a kind of sodium salt NaClO$_4$ was dissociated in an organic solvent of EC:DEC (1:1 vol.) to the concentration of 1 M, which was used as electrolyte.

Figure 14:
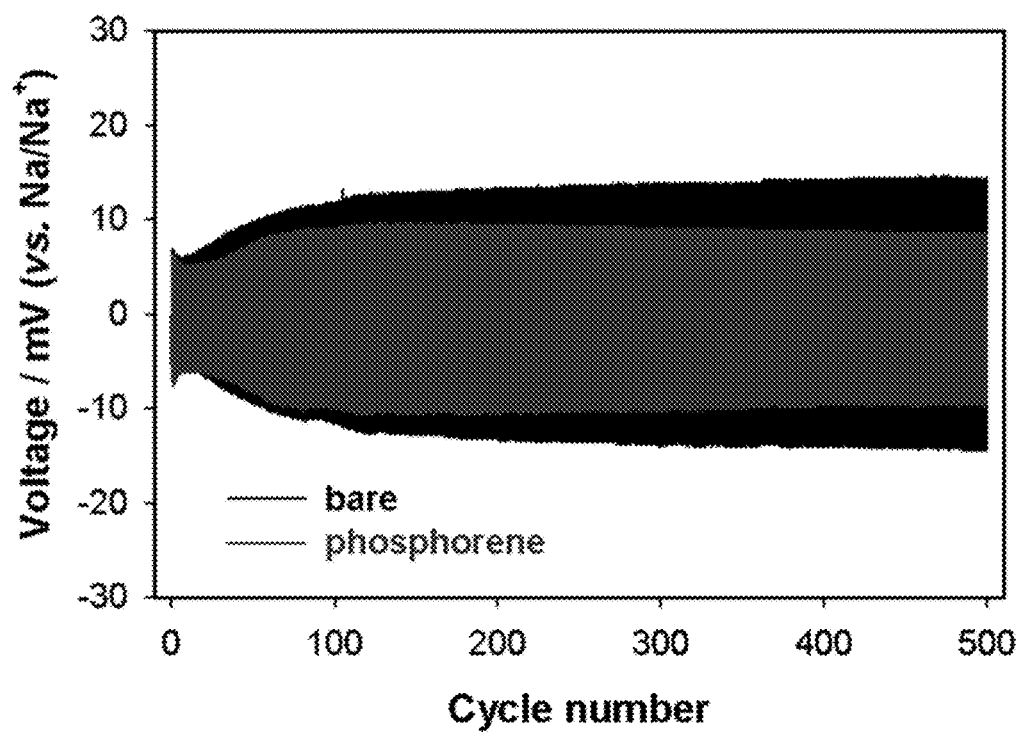
FIG. 14 reports the cycle properties of Example 7 and Comparative Example 7.

In this case, the Na/Na symmetric cells of Example 7 and Comparative Example 7 were charged and discharged at a current rate of 100 μA cm$^{-2}$ for 30 minutes, and the cycle properties were reported in FIG. 14.

According to FIG. 14, it was confirmed that even if a sodium metal anode was used, since the phosphorene-coated sodium metal electrode was used as an anode, it was partially converted into sodium phosphide (Na$_x$P) having high oxidation-reduction potential by electrochemical self-discharge in the electrolyte, and thus, stable SEI was formed, thereby improving electrochemical properties.

That is, it can be assessed that contrary to Comparative Example 7 wherein unstable SEI was formed due to electrolyte decomposition, in Example 7, stable SEI was formed due to the phosphorene and sodium phosphide (Na$_x$P) partially converted therefrom, and thus, additional electrolyte decomposition was minimized when cycle progressed, resistance did not increase, and stable cycle property was exhibited.

The present invention is not limited to the above Examples but can be made in various forms, and it is understood by a person having ordinary knowledge in the art that the present invention can be practiced in different forms without modifying technical ideas or essential features. Therefore, it should be understood that the above described Examples are illustrative in all aspects and are not limitative.

The invention claimed is:

1. An electrode for an electrochemical device comprising a metal electrode, and
a coating layer positioned on the surface of the metal electrode,
wherein the coating layer comprises a two-dimensional semiconductor material, and metal phosphide converted from a part of the two-dimensional semiconductor material, and
wherein the two-dimensional semiconductor material is phosphorene in the form of a monolayer film.

2. The electrode for an electrochemical device according to claim 1, wherein the metal phosphide is represented by the following Chemical Formula 1 or 2:

$$Li_xP \quad \text{[Chemical Formula 1]}$$

$$Na_xP \quad \text{[Chemical Formula 2]}$$

wherein in the Chemical Formulas 1 and 2, x satisfies 0.01≤x≤3.

3. The electrode for an electrochemical device according to claim 1, wherein, based on 100 wt % of the coating layer, the two-dimensional semiconductor material is included in the content of 5 wt % or more and less than 100 wt %, and the metal phosphide is included in the content of greater than 0 wt % and 95 wt % or less.

4. The electrode for an electrochemical device according to claim 1, wherein the thickness of the coating layer is 1 nm to 1 μm.

5. The electrode for an electrochemical device according to claim 1, wherein the thickness of the coating layer is 1 nm to 100 nm.

6. The electrode for an electrochemical device according to claim 1, wherein the metal making up the metal electrode is sodium or lithium.

7. An electrochemical device comprising
a cathode, an anode and electrolyte;
wherein the anode comprises the electrode according to claim 1.

8. The electrochemical device according to claim 7, wherein the metal phosphide is represented by the following Chemical Formula 1 or 2:

$$Li_xP \quad \text{[Chemical Formula 1]}$$

$$Na_xP \quad \text{[Chemical Formula 2]}$$

wherein in the Chemical Formulas 1 and 2, x satisfies 0.01≤x≤3.

9. The electrochemical device according to claim 7, wherein the electrolyte comprises
an organic solvent; and
salts dissociable in the organic solvent.

10. The electrochemical device according to claim 9, wherein the organic solvent is selected from a carbonate-based solvent, a nitrile-based solvent, an ester-based solvent, an ether-based solvent, a ketone-based solvent, an alcohol-based solvent, an aprotic solvent, or a mixture of two or more kinds thereof.

11. The electrochemical device according to claim 9, wherein the dissociable salt is a metal salt of LiPF$_6$, LiBF$_4$, LiSbF$_6$, LiAsF$_6$, LiC$_4$F$_9$SO$_3$, LiClO$_4$, LiAlO$_2$, LiAlCl$_4$, LiN(C$_x$F$_{2x+1}$SO$_2$)(C$_y$F$_{2y+1}$SO$_2$)(wherein, x and y are natural numbers), LiCl, or LiI, or a mixture of two or more kinds thereof.

12. The electrochemical device according to claim 9, wherein the concentration of the salt to the organic solvent is 0.1 to 5 M.

13. The electrochemical device according to claim 7, wherein the cathode is a layered metal oxide electrode, an air electrode, or a sulfur electrode.

14. The electrochemical device according to claim 13, wherein the layered metal oxide electrode comprises layered metal oxide represented by the following Chemical Formula 3:

[Chemical Formula 3]

$$X_aA_{1-b}R_bD_2 \quad \text{[Chemical Formula 3]}$$

wherein in the Chemical Formula 3, X is one or more elements selected from Li and Na,
A is one or more elements selected from Ni, Co, Mn, and V,
R is one or more elements selected from Al, Ni, Co, Mn, Cr, Fe, Mg, Sr, V, and rare earth elements,
D is one or more elements selected from O, F, S, and P,
a satisfies 0≤a≤2.4, and
b satisfies 0≤b≤0.5.

15. The electrochemical device according to claim 7, wherein the electrochemical device is a lithium secondary battery, a sodium secondary battery, a supercapacitor, or a dye-sensitized solar cell.

16. A method for preparing an electrode for an electrochemical device comprising the steps of:
delaminating a layered structure of black phosphorous to prepare a two-dimensional semiconductor material,
forming a coating layer comprising two-dimensional semiconductor material on the surface of a metal electrode; and
converting a part of the two-dimensional semiconductor material in the coating layer into metal phosphide,
wherein the two-dimensional semiconductor material is phosphorene in the form of a monolayer film.

17. The method according to claim 16, wherein, in the step of converting a part of the two-dimensional semiconductor material in the coating layer into metal phosphide, the chemical alloying reaction of a part of the two-dimensional semiconductor material in the coating layer and the metal electrode is achieved at the interface between the coating layer and the metal electrode.

18. The method according to claim 17, wherein by the chemical alloying reaction of a part of the two-dimensional semiconductor material in the coating layer and the metal electrode, metal phosphide represented by the following Chemical formula 1 or 2 is formed:

$Li_xP$  [Chemical Formula 1]

$Na_xP$  [Chemical Formula 2]

wherein in the Chemical Formulas 1 and 2, x satisfies 0.01≤x≤3.

19. The method according to claim 16, wherein, in the step of converting a part of the two-dimensional semiconductor material in the coating layer into metal phosphide, greater than 0 wt % and 95 wt % or less of the total 100 wt % of the two-dimensional semiconductor material in the coating layer is converted into the metal phosphide.

20. The method according to claim 16, wherein the step of delaminating the layered structure of black phosphorous to prepare the two-dimensional semiconductor material is conducted by sonication or mechanical ball milling.

21. The method according to claim 16, wherein the step of forming a coating layer comprising two-dimensional semiconductor material on the surface of a metal electrode is conducted by spin coating, spray coating or sputtering.

* * * * *